US012790181B2

(12) United States Patent
Braun et al.

(10) Patent No.: US 12,790,181 B2
(45) Date of Patent: *Nov. 10, 2026

(54) COVER FOR USE WITH VACUUM HOIST

(71) Applicant: Dell Products L.P., Round Rock, TX (US)

(72) Inventors: Gabriel Jose Braun, El Paso, TX (US); Eduardo Escamilla, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 1078 days.

This patent is subject to a terminal disclaimer.

(21) Appl. No.: 17/956,560

(22) Filed: Sep. 29, 2022

(65) Prior Publication Data

US 2024/0109756 A1 Apr. 4, 2024

(51) Int. Cl.
*B66C 1/62* (2006.01)
*B66C 1/02* (2006.01)
*H05K 7/14* (2006.01)

(52) U.S. Cl.
CPC .............. *B66C 1/62* (2013.01); *B66C 1/0281* (2013.01); *H05K 7/1485* (2013.01)

(58) Field of Classification Search
CPC ........... B66C 1/62; B66C 1/0281; B66C 1/02; H05K 7/1485
See application file for complete search history.

(56) References Cited

U.S. PATENT DOCUMENTS

| | | | | |
|---|---|---|---|---|
| 6,711,859 | B2 * | 3/2004 | Bell | H05K 5/13 49/501 |
| 11,169,581 | B1 * | 11/2021 | Lewis | H05K 5/0226 |
| 11,352,818 | B2 * | 6/2022 | Mori | G06F 1/1681 |
| 11,449,110 | B2 * | 9/2022 | Lin | G06F 1/181 |
| 12,389,557 | B2 * | 8/2025 | Wingfield | B25J 15/065 |
| 2009/0140618 | A1 * | 6/2009 | Kodaira | G06F 1/1635 312/223.6 |

* cited by examiner

*Primary Examiner* — Stephen A Vu
(74) *Attorney, Agent, or Firm* — Jackson Walker L.L.P.

(57) ABSTRACT

A cover assembly may include a cover having a top surface which is generally planar and substantially void of any features formed thereon and an attach and release mechanism mechanically coupled to the top surface and configured to mechanically engage with a corresponding engagement feature of a physical object in order to mechanically retain the cover assembly in a fixed position relative to the physical object.

19 Claims, 5 Drawing Sheets

COVER FOR USE WITH VACUUM HOIST

TECHNICAL FIELD

The present disclosure relates in general to information handling systems, and more particularly to systems and methods for providing a removable cover for a physical object, such as an information handling system server, wherein such removable cover is adapted for use with a vacuum hoist for lifting and moving the physical object.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system servers are often heavy and difficult for a person to lift without the aid of specialized tools or devices to assist in lifting and moving servers. This is particularly true in packaging of servers into boxes, as repetitive lifting and moving of servers may cause injury to an operator. Accordingly, vacuum hoists are often used for packaging heavy server products, so as to prevent injury to an operator, prevent damage to the server products being packaged, and allow for a single operator to package a heavy server. A vacuum hoist may comprise a system, device, or apparatus that employs a mechanical vacuum wherein vacuum heads are engaged with a surface of the server to create a mechanical force that offsets and/or overcomes the force of gravity upon the server to lift and move the server.

However, one disadvantage in using vacuum hoists is that servers often include seams and embossing that render it difficult for vacuum heads of the vacuum hoist to form an airtight vacuum seal. Thus, in some instances, vacuum heads may not fully attach, leading to risk of dropping of the server, which could cause damage. Further, some segments of a surface of an information handling system server may deform during lifting, which could also damage the server.

Accordingly, systems and methods that overcome such disadvantages may be desirable.

SUMMARY

In accordance with the teachings of the present disclosure, the disadvantages and problems associated with use of a vacuum hoist to lift and move an information handling system or other physical object may be reduced or eliminated.

In accordance with embodiments of the present disclosure, a cover assembly may include a cover having a top surface which is generally planar and substantially void of any features formed thereon and an attach and release mechanism mechanically coupled to the top surface and configured to mechanically engage with a corresponding engagement feature of a physical object in order to mechanically retain the cover assembly in a fixed position relative to the physical object.

In accordance with these and other embodiments of the present disclosure, a method for forming a cover assembly may include configuring an attach and release mechanism to mechanically engage with a corresponding engagement feature of a physical object in order to mechanically retain the cover assembly in a fixed position relative to the physical object and mechanically coupling the attach and release mechanism to a top surface of a cover, wherein the top surface is generally planar and substantially void of any features formed thereon.

In accordance with these and other embodiments of the present disclosure, a method may include, with a cover assembly having a cover having a top surface which is generally planar and substantially void of any features formed thereon and an attach and release mechanism mechanically coupled to the top surface and configured to mechanically engage with a corresponding engagement feature of a physical object in order to mechanically retain the cover assembly in a fixed position relative to the physical object: mechanically engaging the attach and release mechanism to the corresponding engagement feature of the physical object and applying a force to the top surface of the cover with one or more vacuum heads of a vacuum hoist in order to lift and move the physical object.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

Figure 1:
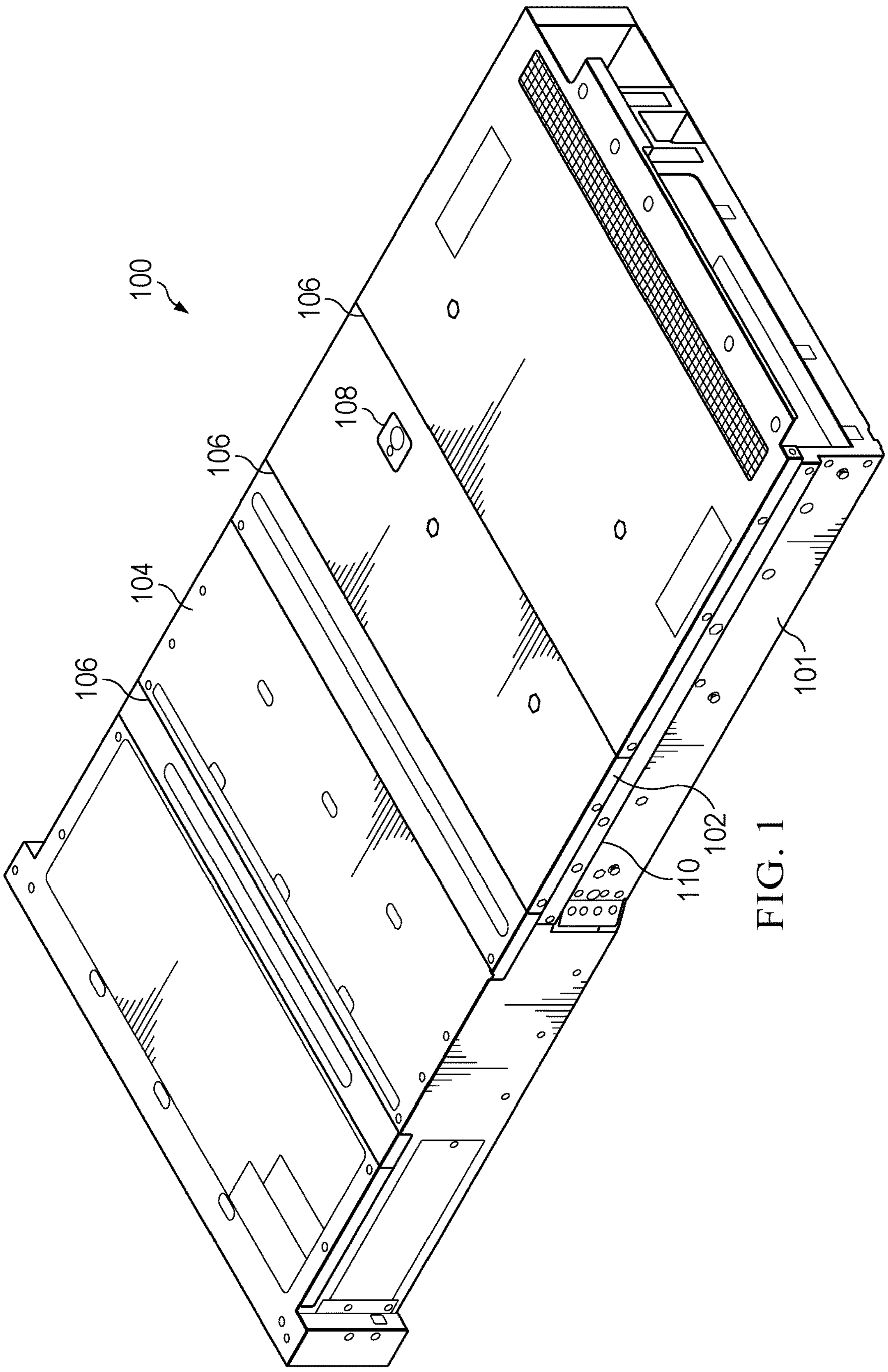
FIG. 1 illustrates a perspective view of an example information handling system server, in accordance with embodiments of the present disclosure.

FIG. 1 illustrates a perspective view of an example information handling system server 100, in accordance with embodiments of the present disclosure. As shown in FIG. 1, server 100 may include a chassis 101 made of metal or other suitable material for housing functional components of the server 100 (e.g., processors, memories, storage drives, fans, etc.). Chassis 101 may include, among other things, sides 102, a top 104, and a bottom. As shown in FIG. 1, top 104 may include a generally planar surface that may include features, such as seams 106 and embosses 108, that may pose difficulties for a vacuum head of a vacuum hoist to form an airtight vacuum seal of the surface of top 104. As also shown in FIG. 1, enclosure 101 may include rail attachment features 110 configured to mechanically engage with corresponding rails of an enclosure (e.g., server rack or server tower) in order to locate and retain chassis 101 within a desired location of such enclosure.

Figure 2:
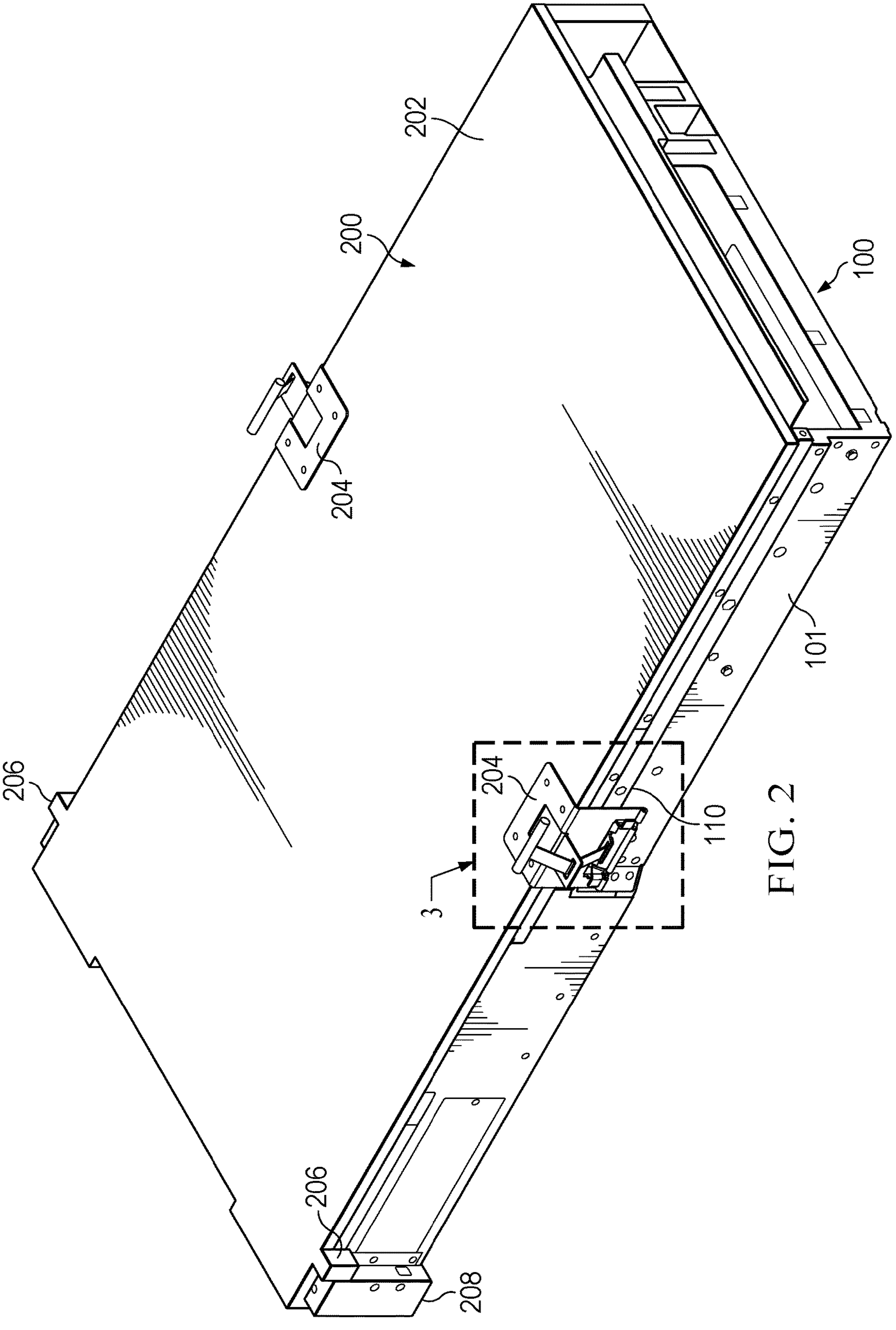
FIG. 2 illustrates a perspective view of a removable cover assembly mechanically coupled to an information handling system server, the cover assembly for use with a vacuum hoist for lifting and moving the information handling system server, in accordance with embodiments of the present disclosure.

FIG. 2 illustrates a perspective view of a removable cover assembly 200 mechanically coupled to information handling system server 100, wherein removable cover assembly 200 may be used with a vacuum hoist for lifting and moving information handling system server 100, in accordance with embodiments of the present disclosure. As shown in FIG. 2, removable cover assembly 200 may comprise a cover 202, a plurality of attach and release mechanisms 204, and one or more alignment features 206.

Cover 202 may have a top surface which is generally planar and substantially void of any features formed thereon or therein that may negatively affect forming of an airtight vacuum seal by a vacuum head of a vacuum hoist. Cover 202 may be formed from any suitable material, including without limitation metal, plastic, or ceramic.

Figure 4:
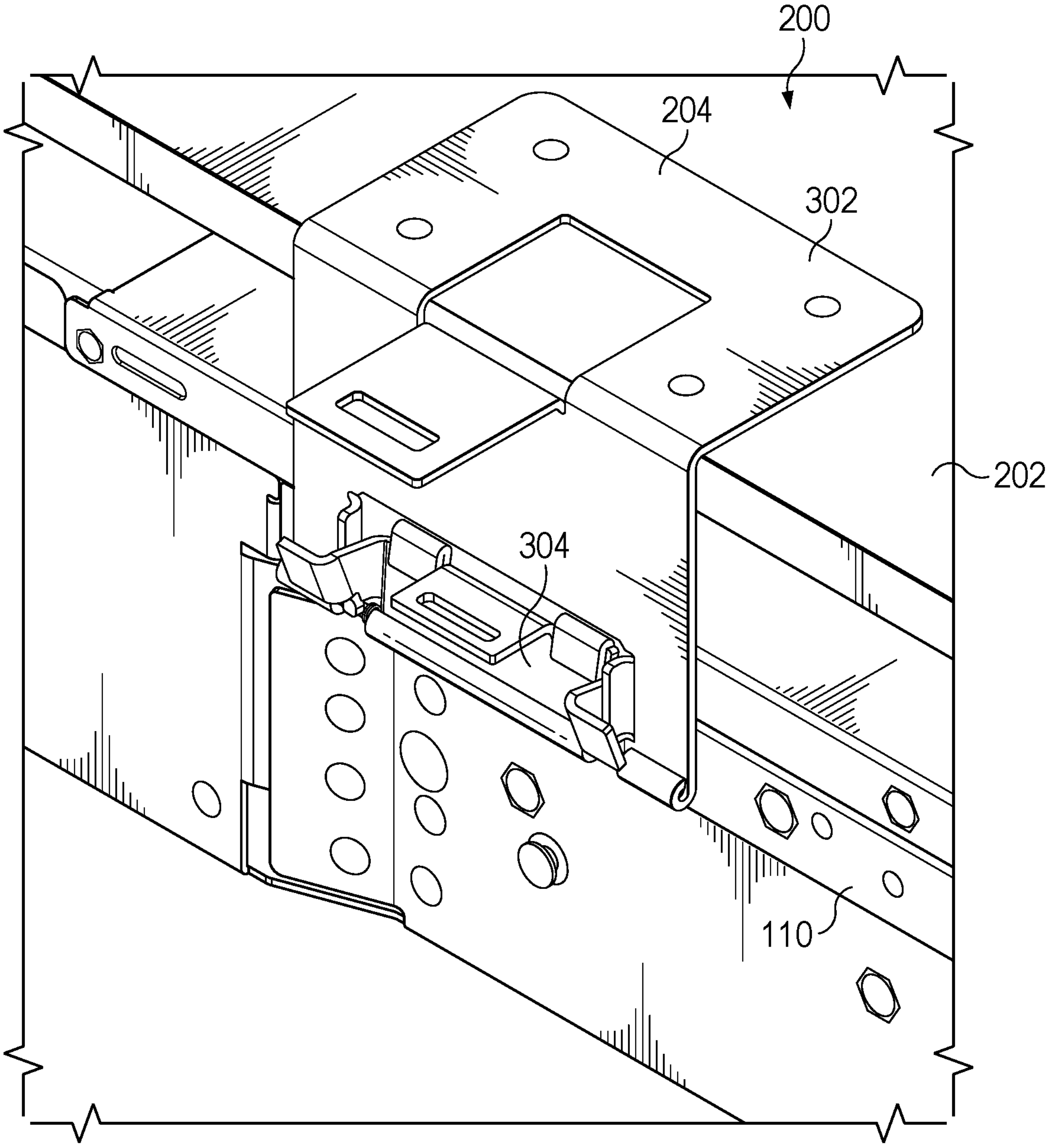
FIG. 4 illustrates functionality of a catch of the attach and release mechanism as a cover assembly including when the attach and release mechanism is mechanically engaged with an engagement feature of an information handling system server corresponding to the catch, in accordance with embodiments of the present disclosure.
Figure 5:
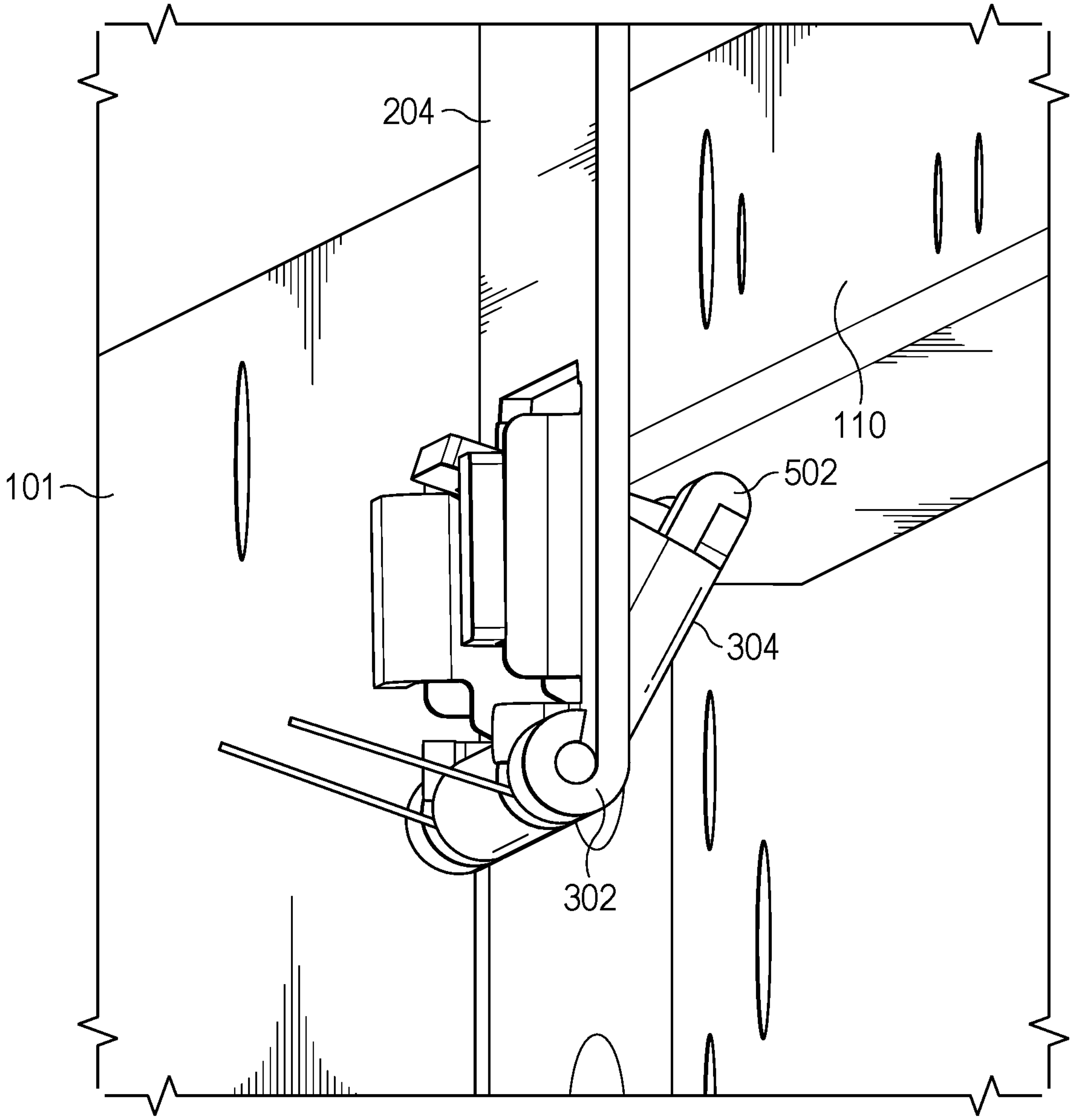
FIG. 5 illustrates functionality of the catch depicted in FIG. 4 once the attach and release mechanism is fully mechanically engaged with a corresponding engagement feature of an information handling system server, in accordance with embodiments of the present disclosure.

Each attach and release mechanism 204 may be mechanically coupled (e.g., via fastener, adhesive, weld, etc.) to the top surface of cover 202 and may include any suitable system, device, or apparatus configured to mechanically engage with a rail attachment feature 110 of chassis 101 in order to mechanically retain cover assembly 200 in a fixed position relative to chassis 101. Example embodiments of an attach and release mechanism 204 are represented by FIGS. 3-5 described below.

Each alignment feature 206 may protrude from cover 202 and may be configured (e.g., sized and/or shaped) to mechanically engage with a corresponding feature (e.g., a bezel 208) of chassis 101 in order to assist an operator in aligning/locating cover assembly 200 relative to chassis 101.

Figure 3:
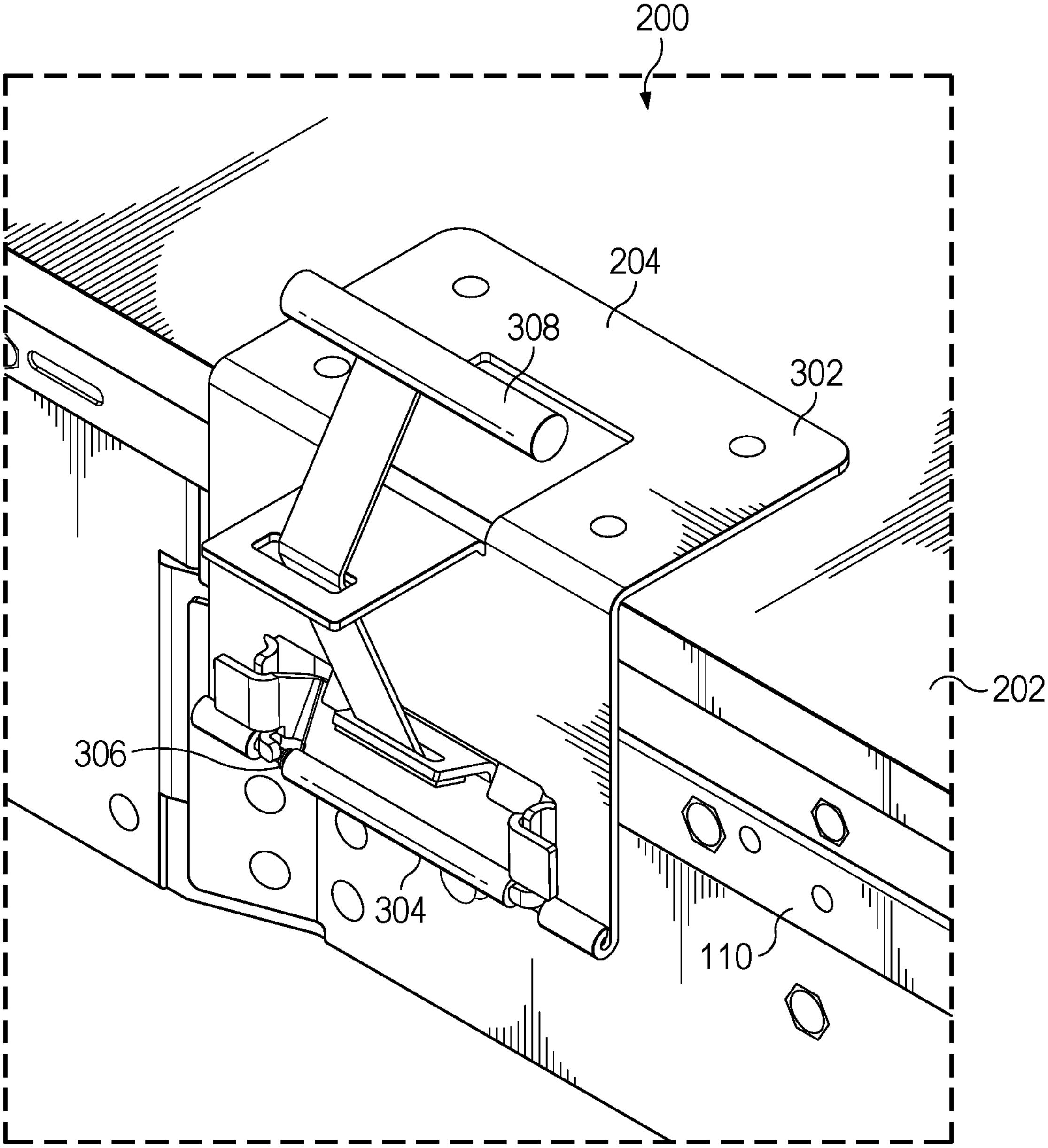
FIG. 3 illustrates a detailed perspective view of an attach and release mechanism for mechanically coupling a removable cover assembly to an information handling system server, in accordance with embodiments of the present disclosure.

FIG. 3 illustrates a detailed perspective view of an attach and release mechanism 204 engaged with a rail attachment feature 110 of chassis 101, in accordance with embodiments of the present disclosure. As shown in FIG. 3, attach and release mechanism 204 may comprise a bracket 302, a catch 304 rotatably coupled to bracket 302, a torsion spring 306 mechanically coupled between bracket 302 and catch 304, and a release handle 308 mechanically coupled to bracket 302 and catch 304.

As depicted in FIG. 3, bracket 302 may have a generally L-shaped profile, such that a top portion of bracket 302 may align with and mechanically couple to the top surface of cover 202 and a side portion generally perpendicular to the top portion may extend parallel to a side 102 of chassis 101.

Catch 304 may rotatably couple to bracket 302 at an axis located proximate to the bottom edge of the side portion of bracket 302 and may have mechanical features that extend therefrom configured to engage with a rail attachment feature 110 of chassis 101 when cover assembly 202 is fully engaged with chassis 101, as described in greater detail below in reference to FIGS. 4 and 5.

Torsion spring 306 may be mechanically coupled between bracket 302 and catch 304, and may be arranged such that a spring force of torsion spring 306 biases catch 304 in an engaged position relative to bracket 302, as described in greater detail below.

Release handle 308 may be arranged relative to bracket 302 and catch 304 such that an operator or other force acting upon release handle 308 may interact upon release handle 308 to overcome the spring force of torsion spring 306 to release attach and release mechanism 204 from chassis 101, as described in greater detail below. In some embodiments, release handle 308 may be readily removable from attach and release mechanism 204, in order to minimize a likelihood of accidental release of catch 304 from chassis 101.

FIG. 4 illustrates functionality of catch 304 of attach and release mechanism 204 as cover assembly 200 is mechanically engaged with an engagement feature (e.g., rail attachment feature 110) of information handling system server 100, in accordance with embodiments of the present disclosure. In order to mechanically couple cover assembly 200 to information handling system server 100, an operator may lower cover assembly 200 onto top surface 104 of chassis 101 and use one or more alignment features 206 and corresponding alignment features of chassis 101 (e.g., bezel 208) to position cover assembly 200 relative to information handling system server 100. Once aligned using alignment features of chassis 101, the operator may further lower cover assembly 200 onto top surface 104 of chassis 101, during which a side surface of rail attachment feature 110 may apply a mechanical force onto catch 304 to overcome the spring force of torsion spring 306 in order to cause catch 304 to rotate to the unengaged position relative to bracket 302.

Once catch 304 has passed over rail attachment feature 110, rail attachment feature 110 may cease to apply a mechanical force to catch 304 that overcomes the spring force of torsional spring 306, and thus the spring force of torsional spring 306 may cause catch 304 to rotate to the engaged position such that an engagement feature 502 of catch 304 extending from the axis at which catch 304 is coupled to bracket 302 engages with a bottom edge of rail attachment feature 110 in order to mechanically retain cover assembly 200 in a fixed position relative to information handling system server 100. FIG. 5 illustrates functionality of catch 304 once attach and release mechanism 204 is fully mechanically engaged with a corresponding engagement feature (e.g., rail attachment feature 110), in accordance with embodiments of the present disclosure.

With cover assembly 200 mechanically affixed to information handling system server 100, an operator may cause one or more vacuum pads of a vacuum hoist to engage with the top surface of cover 202 in order to lift and/or move information handling system server 100 to a desired location (e.g., into a box or other packaging). Once information handling system server 100 has been moved to a desired location, the operator may interact with release handle 308 to mechanically release cover assembly 200 from information handling system server 100.

Although the foregoing discussion contemplates use of a cover assembly to lift and move an information handling system server, the systems and methods disclosed herein may also be applied to using a cover assembly to lift and move any suitable physical object.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A cover assembly, comprising:

a cover having a top surface which is generally planar and substantially void of any features formed thereon; and an attach and release mechanism mechanically coupled to the top surface and configured to mechanically engage with a corresponding engagement feature of a physical object in order to mechanically retain the cover assembly in a fixed position relative to the physical object.

2. The cover assembly of claim 1, further comprising an alignment feature protruding from the cover configured to mechanically engage with a corresponding feature of the physical object in order to aid in locating the cover assembly relative to the physical object.

3. The cover assembly of claim 2, wherein:

the physical object is an information handling system server; and the corresponding feature is a bezel of the information handling system server.

4. The cover assembly of claim 1, wherein the physical object is an information handling system server.

5. The cover assembly of claim 4, wherein the corresponding engagement feature comprises a rail attachment feature configured to align and locate the information handling system server in a server enclosure.

6. The cover assembly of claim 1, wherein the attach and release mechanism comprises:

a bracket; and a catch rotatably coupled to the bracket and having a mechanical feature extending therefrom configured to engage with the corresponding engagement feature of the physical object when the cover assembly is fully engaged with the physical object.

7. The cover assembly of claim 6, the attach and release mechanism further comprising a torsion spring mechanically coupled between the bracket and the catch and arranged such that a spring force of the torsion spring biases the catch in an engaged position relative to the bracket wherein the catch mechanically engages the corresponding engagement feature of the physical object to mechanically retain the cover assembly to the physical object.

8. The cover assembly of claim 7, the attach and release mechanism further comprising a release handle mechanically coupled to and arranged relative to the bracket and the catch such that an external force can be applied to the release handle to overcome the spring force of the torsion spring to cause rotation of the catch relative to the bracket in order to mechanically disengage the catch from the corresponding engagement feature of the physical object.

9. The cover assembly of claim 8, wherein the release handle is readily removable from the attach and release mechanism.

10. A method for forming a cover assembly, comprising:

configuring an attach and release mechanism to mechanically engage with a corresponding engagement feature of a physical object in order to mechanically retain the cover assembly in a fixed position relative to the physical object; and mechanically coupling the attach and release mechanism to a top surface of a cover, wherein the top surface is generally planar and substantially void of any features formed thereon.

11. The method of claim 10, further comprising forming an alignment feature protruding from the cover and configured to mechanically engage with a corresponding feature of the physical object in order to aid in locating the cover assembly relative to the physical object.

12. The method of claim 11, wherein:

the physical object is an information handling system server; and the corresponding feature is a bezel of the information handling system server.

13. The method of claim 10, wherein the physical object is an information handling system server.

14. The method of claim 13, wherein the corresponding engagement feature comprises a rail attachment feature configured to align and locate the information handling system server in a server enclosure.

15. The method of claim 10, wherein configuring the attach and release mechanism comprises rotatably coupling a bracket to a catch having a mechanical feature extending therefrom configured to engage with the corresponding engagement feature of the physical object when the cover assembly is fully engaged with the physical object.

16. The method of claim 15, wherein configuring the attach and release mechanism further comprises mechanically coupling a torsion spring between the bracket and the catch and arranging the torsion spring such that a spring force of the torsion spring biases the catch in an engaged position relative to the bracket wherein the catch mechanically engages the corresponding engagement feature of the physical object to mechanically retain the cover assembly to the physical object.

17. The method of claim 16, wherein configuring the attach and release mechanism further comprises mechanically coupling the attach and release mechanism further comprising a release handle mechanically coupled to and arranged relative to the bracket and the catch such that an external force can be applied to the release handle to overcome the spring force of the torsion spring to cause rotation of the catch relative to the bracket in order to mechanically disengage the catch from the corresponding engagement feature of the physical object.

18. The method of claim 17, wherein the release handle is readily removable from the attach and release mechanism.

19. A method comprising, with a cover assembly having a cover having a top surface which is generally planar and substantially void of any features formed thereon and an attach and release mechanism mechanically coupled to the top surface and configured to mechanically engage with a corresponding engagement feature of a physical object in order to mechanically retain the cover assembly in a fixed position relative to the physical object:

mechanically engaging the attach and release mechanism to the corresponding engagement feature of the physical object; and applying a force to the top surface of the cover with one or more vacuum heads of a vacuum hoist in order to lift and move the physical object.

* * * * *